(12) United States Patent
Matsumoto et al.

(10) Patent No.: US 7,368,988 B2
(45) Date of Patent: May 6, 2008

(54) HIGH-FREQUENCY POWER AMPLIFIER

(75) Inventors: Hidetoshi Matsumoto, Kokubunji (JP); Tomonori Tanoue, Machida (JP); Isao Ohbu, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 37 days.

(21) Appl. No.: 11/489,609

(22) Filed: Jul. 20, 2006

(65) Prior Publication Data

US 2007/0046370 A1    Mar. 1, 2007

(30) Foreign Application Priority Data

Aug. 31, 2005   (JP)   ............................. 2005-251117

(51) Int. Cl.
   *H03G 5/16*     (2006.01)
(52) U.S. Cl. ...................... 330/133; 330/285
(58) Field of Classification Search ................. 330/98, 330/133, 134, 150, 285, 296, 310
   See application file for complete search history.

(56) References Cited

U.S. PATENT DOCUMENTS 6,236,266 B1 *   5/2001   Choumei et al. ............ 330/133
6,701,138 B2     3/2004   Epperson et al. ............ 455/127
7,038,546 B2 *   5/2006   Kuriyama .................... 330/133
7,049,892 B2 *   5/2006   Matsunaga et al. ......... 330/285

FOREIGN PATENT DOCUMENTS

| JP | 2000-332542 | 11/2000 |
|----|-------------|---------|
| JP | 2004-40418  | 2/2004  |

* cited by examiner

*Primary Examiner*—Khanh Van Nguyen
(74) *Attorney, Agent, or Firm*—Miles & Stockbridge P.C.

(57) ABSTRACT

In a base-bias-control-type high-frequency power amplifier with a plural stage configuration, a rising voltage of a base bias current supplied to an initial stage transistor is made lower than a rising voltage of a base bias current supplied to a second stage transistor by a bias circuit, and a difference between the both voltages is set to be smaller than a base-emitter voltage of an amplifying stage transistor. Also, a rising voltage of a base bias current supplied to a third stage transistor is made equal to the rising voltage of the base bias current supplied to an initial stage transistor. Accordingly, a technology capable of improving the power control linearity can be provided in a high-frequency power amplifier used in a polar-loop transmitter or the like.

10 Claims, 7 Drawing Sheets

HIGH-FREQUENCY POWER AMPLIFIER

CROSS-REFERENCE TO RELATED APPLICATION

The present application claims priority from Japanese Patent Application No. JP 2005-251117 filed on Aug. 31, 2005, the content of which is hereby incorporated by reference into this application.

TECHNICAL FIELD OF THE INVENTION

The present invention relates to a high-frequency power amplifier with a multi-stage configuration, which is used in a mobile phone terminal or the like. In particular, it relates to a technology effectively applied to a high-frequency power amplifier having a base-bias-control-type power control function and suitable for use in a polar-loop transmitter.

BACKGROUND OF THE INVENTION

As a technology for a high-frequency power amplifier with a multi-stage configuration used in, for example, a mobile phone terminal or the like, the inventors of the present invention have examined the following technologies.

Recently, the mobile phones have rapidly spread and high-level services such as image communication also have become widely used. In order to respond to rapid increase in communication traffic amount, practical application of a third-generation system such as an EDGE system or W-CDMA system has started. The EDGE system is the third-generation system obtained by expanding communication speed of a GSM system which is a mainstream of the second-generation system and it can share the same frequency band with the GSM system, and thus, the spreading thereof in the future is expected.

A polar-loop transmitter is known as a transmitter configuration suitable for the EDGE system, and a configuration example thereof is shown in FIG. 2. The polar-loop transmitter includes an input terminal (IF input) 1, a phase detector (PD) 2, a VCO (voltage controlled oscillator) 3, a high-frequency power amplifier (PA) 4, a directional coupler (Coupler) 5, an output terminal (RF output) 6, an amplitude detector (AMD) 7, a variable gain amplifier (IVGA) 8, a down conversion mixer (DCM) 9, a variable gain amplifier (MVGA) 10, and a control terminal (Vramp) 11.

An IF input signal from the input terminal 1 is inputted into the phase detector 2 and the amplitude detector 7. The phase detector 2 outputs a voltage corresponding to a phase difference between the IF input signal and a feedback signal from the variable gain amplifier 10. An RF output from the VCO 3 is phase-modulated by an output from the phase detector 2. The amplitude detector 7 outputs a voltage corresponding to an amplitude difference between the IF input signal and a feedback signal from the variable gain amplifier 10. An output from the amplitude detector 7 is amplified by the variable gain amplifier 8. An output from the VCO 3 is amplified by the high-frequency power amplifier 4 and it is simultaneously amplitude-modulated by a signal from the variable gain amplifier 8. An output signal from the high-frequency power amplifier 4 is outputted to the output terminal 6 via the directional coupler 5. A part of the output signal from the high-frequency power amplifier 4 is branched at the directional coupler 5 to be inputted into the down conversion mixer 9 and then converted to an IF signal. An output from the down conversion mixer 9 is amplified by the variable gain amplifier 10 to be supplied as a feedback signal to the phase detector 2 and the amplitude detector 7. Gains in the variable gain amplifier 8 and the variable gain amplifier 10 are varied by a control signal from the control terminal 11.

In the polar-loop transmitter, linearity required for the EDGE system is satisfied by using a phase feedback loop configured of the phase detector 2, the VCO 3, the high-frequency power amplifier 4, the directional coupler 5, the down conversion mixer 9, and the variable gain amplifier 10 and an amplitude feedback loop configured of the amplitude detector 7, the variable gain amplifier 8, the high-frequency power amplifier 4, the directional coupler 5, the down conversion mixer 9, and the variable gain amplifier 10.

The high-frequency power amplifier 4 used in the polar-loop transmitter is a high-frequency power amplifier having a power control function, which has been conventionally used in the GSM system. However, a high-frequency power amplifier excellent in linearity of power control must be used in order to achieve the stable operation of the amplitude feedback loop.

As the technologies relating to such a high-frequency power amplifier, for example, the technologies described in Patent Documents 1 to 4 are known.

Japanese Patent Application Laid-Open Publication No. 2000-332542 (Patent Document 1) describes a bias circuit for a multi-stage power amplifier in which, in order to suppress increase of Rx noise at an output power reduction time in the multi-stage power amplifier configured of HBTs performing power amplification of a high-frequency signal, a signal Vapc inputted from an external control circuit is outputted only to a base of an HBT constituting an initial-stage amplifier in the power amplifier and a bias current from a constant voltage circuit whose operation is controlled by the signal Vapc is supplied to respective bases of the HBTs constituting the other amplifiers in the power amplifier.

Japanese Patent Application Laid-Open Publication No. 2004-40418 (Patent Document 2) describes a wireless machine in which a control voltage for varying transmission output supplied to a drive amplifier and a final amplifier is optimized so that the drive amplifier and the final amplifier always operate at their optimal operation points with respective transmission outputs. By this means, since the transmission efficiency can be improved, it is possible to achieve power saving and to widen the variable range of transmission output.

SUMMARY OF THE INVENTION

Incidentally, the inventors of the present invention have examined the technology of such a high-frequency power amplifier and have found the following facts.

For example, as a high-frequency power amplifier excellent in power control linearity, an LDO (Low Drop Out) control type high-frequency power amplifier is known. One example of a circuit of such a high-frequency power amplifier is shown in FIG. 3. This is an example described in U.S. Pat. No. 6,701,138 (Patent Document 3). A high-frequency power amplifier shown in FIG. 3 includes an input terminal (RFin) 21, an initial stage amplifying circuit (1st) 22, a second stage amplifying circuit (2nd) 23, a third stage amplifying circuit (3rd) 24, an output terminal (RFout) 25, a bias circuit (Bias Network) 26, an actuating terminal (TX enable) 27, a power source terminal (Vprim) 28, a control terminal (Vramp) 29, an LDO 35, an actuating terminal (TX enable) 33, and a power source terminal (Vprim) 34. The LDO 35 is configured of an error amplifier 30, a constant voltage circuit (Regulator) 31, and a feedback circuit (H(s)) 32.

An input RF signal from the input terminal 21 is sequentially amplified by the initial stage amplifying circuit 22, the second stage amplifying circuit 23, and the third stage amplifying circuit 24 to be outputted to the output terminal 25. The bias circuit 26 is On/OFF-controlled by a signal from the actuating terminal 27 to supply a bias voltage to each amplifying circuit. Power to the initial stage amplifying circuit 22 is directly supplied from the power source terminal 28. Power to the second stage amplifying circuit 23 and the third stage amplifying circuit 24 is supplied from the power source terminal 34 via the LDO 35. The constant voltage circuit 31 in the LDO 35 is feedback-controlled by using the feedback circuit 32 and the error amplifier 30. The LDO 35 is ON/OFF-controlled by the actuating terminal 33, and an output voltage thereof at ON time is linearly controlled by a signal from the control terminal 29.

In the high-frequency power amplifier shown in FIG. 3, the LDO 35 is used to vary the power source voltages to the second stage amplifying circuit 23 and the third stage amplifying circuit 24, thereby controlling an RF output power. Since a relationship between the power source voltage of the amplifying circuit and the output power thereof is excellent in linearity, the high-frequency power amplifier shown in FIG. 3 is excellent in power control linearity, and it can be used in the polar-loop transmitter. However, since wasteful power consumption which does not contribute to high-frequency amplification occurs due to a voltage drop at the constant voltage circuit 31 in the LDO 35, a power added efficiency decreases.

As another type of a high-frequency power amplifier conventionally used in the GSM system, a bias-control-type high-frequency power amplifier is known. One example of a circuit of such a high-frequency power amplifier is shown in FIG. 4. This is an example described in U.S. Pat. No. 6,236,266 (Patent Document 4). A high-frequency power amplifier shown in FIG. 4 includes an input terminal 41, a matching circuit 42, an initial stage transistor 43, a feedback circuit 44, a power source circuit 45, a matching circuit 46, a second stage transistor 47, a feedback circuit 48, a power source circuit 49, a matching circuit 50, a third stage transistor 51, a feedback circuit 52, a power source circuit 53, a matching circuit 54, an output terminal 55, a bias circuit 56, and a control terminal 57.

An RF input signal from the input terminal 41 is amplified via the matching circuit 42, the initial stage transistor 43, the matching circuit 46, the second stage transistor 47, the matching circuit 50, the third stage transistor 51, and the matching circuit 54 to be outputted to the output terminal 55. The respective stage transistors 43, 47, and 51 are respectively attached with feedback circuits 44, 48, and 52 to be stabilized. Also, power is supplied from the power source circuits 45, 49, and 53 to the respective stage transistors 43, 47, and 51. The bias circuit 56 controlled by a signal from the control terminal 57 supplies bias current to the respective stage transistors 43, 47, and 51.

Details of the bias circuit 56 are shown in FIG. 5. The bias circuit 56 includes a control terminal 57, a resistor 62, and constant voltage circuits 63 and 74. The constant voltage circuit 63 is configured of a resistor 64, a transistor 65, a resistor 66, a resistor 67, and a transistor 68. The constant voltage circuit 74 is configured of a resistor 69, a transistor 70, a resistor 71, a resistor 72, and a transistor 73.

A bias current Ia to the initial stage transistor 43 starts to flow when a control voltage Vapc of the control terminal 57 becomes higher than a base-emitter voltage Vbe of the transistor, where a relationship of Ia∝Vapc−Vbe is present. A bias current Ib to the second stage transistor 47 and a bias current Ic to the third stage transistor 51 start to flow when Vapc becomes higher than 2 Vbe, where a relationship of Ib, Ic∝Vapc−2 Vbe is present.

Another example of a circuit of the bias circuit 56 described in the Patent Document 4 is shown in FIG. 6. This bias circuit 56a includes a control terminal 57a and constant voltage circuits 88, 89, and 90. Bias currents Ia, Ib, and Ic to the respective stage transistors 43, 47, and 51 start to flow when the control voltage Vapc of the control terminal 57a becomes higher than 2 Vbe, where a relationship of Ia∝Vapc−2 Vbe is present.

In the bias-control-type high-frequency power amplifier shown in FIG. 4, since power supply to the respective stage transistors 43, 47, and 51 is conducted via the low-loss power source circuits 45, 49, and 53, wasteful power consumption like that in the LDO-control-type high-frequency power amplifier shown in FIG. 3 can be prevented and the efficiency thereof can be improved. However, a bias-control-type high-frequency power amplifier using the bias circuit shown in FIG. 5 or FIG. 6 is poor in linearity of power control and it cannot be used in the polar-loop transmitter.

A bias-control-type high-frequency power amplifier using the bias circuit shown in FIG. 5 is manufactured by way of trial, and measurement using the same is performed. The measurement result thereof is shown in FIG. 7. FIG. 7A is a graph showing characteristics of the bias circuit, where a horizontal axis represents a control voltage Vapc and a vertical axis represents bias currents Ia, Ib, and Ic. As described above, a rising voltage of Ia is equal to Vbe, and rising voltages of Ib and Ic are equal to 2 Vbe. FIG. 7B is a graph showing power control characteristic, where a horizontal axis represents a control voltage Vapc and a vertical axis represents an effective value Vout of an output voltage amplitude and its differentiation dVout/dVapc. In order to use the bias-control-type high-frequency power amplifier in the polar-loop transmitter, dVout/dVapc must be kept almost constant in a wide range of the control voltage. In FIG. 7B, however, it is understood that dVout/dVapc varies largely depending on the value of Vapc and the power control linearity is poor.

Similarly, a bias-control-type high-frequency power amplifier using the bias circuit shown in FIG. 6 is manufactured by way of trial, and measurement using the same is performed. The measurement result thereof is shown in FIG. 8. It is understood from FIG. 8A that rising voltages of Ia, Ib, and Ic in this case are equal to 2 Vbe. Regarding power control characteristic shown in FIG. 8B, it is also understood that dVout/dVapc varies largely and power control linearity is poor.

In view of these circumstances, an object of the present invention is to provide a technology capable of solving such a problem of power control linearity in a high-frequency power amplifier.

The above and other objects and novel characteristics of the present invention will be apparent from the description of this specification and the accompanying drawings.

The typical ones of the inventions disclosed in this application will be briefly described as follows.

That is, in a high-frequency power amplifier of the present invention, a rising voltage of a base bias current supplied to an initial amplifying stage transistor of plural amplifying stage transistors is lower than that of a base bias current supplied to amplifying stage transistors other than the initial amplifying stage transistor, and a difference between both the rising voltages is smaller than a base-emitter voltage of the amplifying stage transistor.

More specifically, a high-frequency power amplifier according to the present invention comprises: a plurality of amplifying stage transistors; and a bias circuit which supplies a base bias current to each amplifying stage transistor of the plurality of amplifying stage transistors, wherein the base bias current supplied to each amplifying stage transistor varies linearly to a control voltage inputted into the bias circuit, a first control voltage at which a first base bias current supplied to a first amplifying stage transistor in an initial stage of the plurality of amplifying stage transistors rises is lower than a second control voltage at which a second base bias current supplied to a second amplifying stage transistor other than the initial stage rises, and a difference between the second control voltage and the first control voltage is smaller than a base-emitter voltage of the amplifying stage transistor.

According to the present invention, power control linearity of a high-frequency power amplifier can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
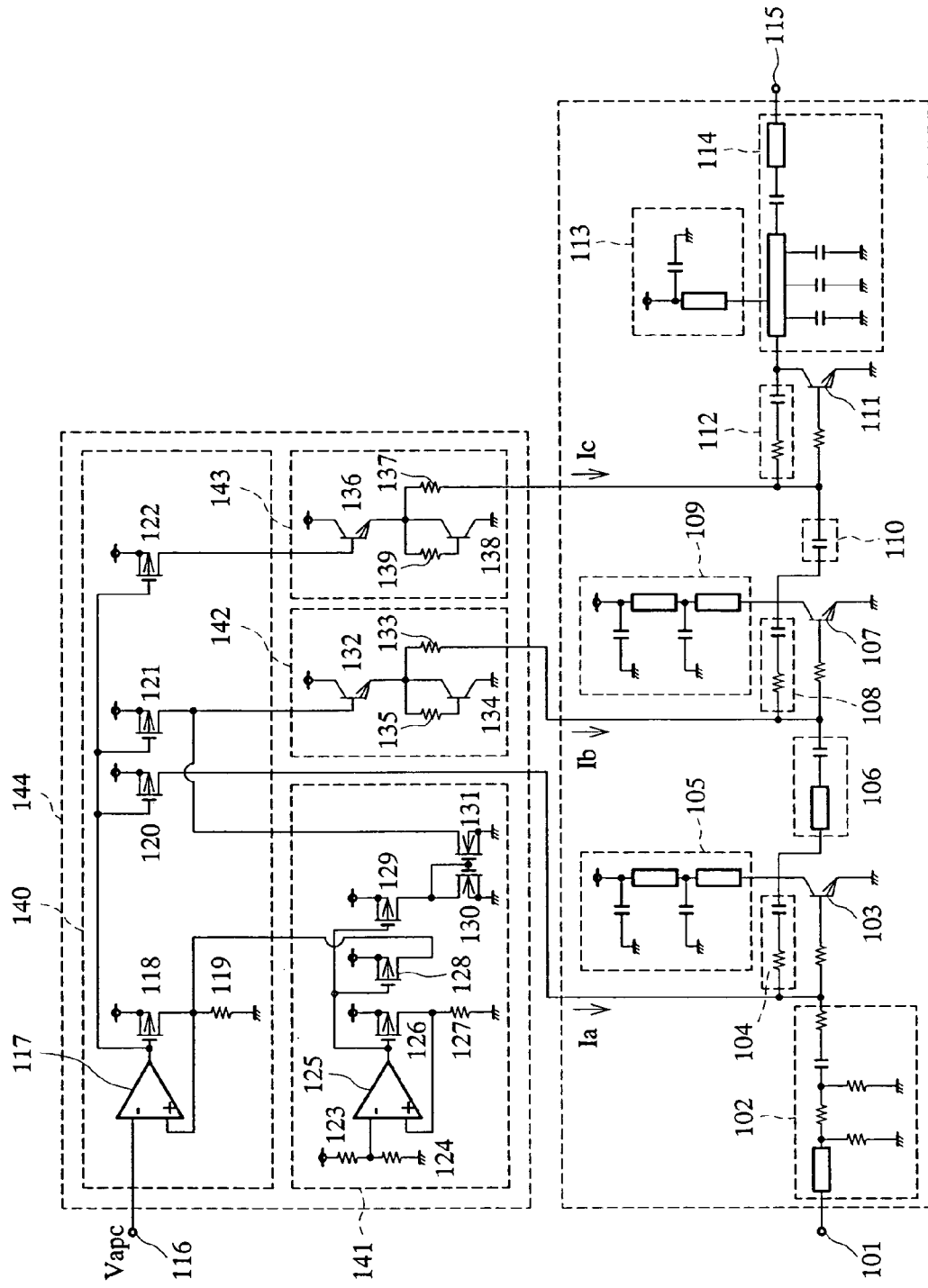
FIG. 1 is a circuit diagram showing a configuration of a base-bias-control-type high-frequency power amplifier according to an embodiment of the present invention.
Figure 2:
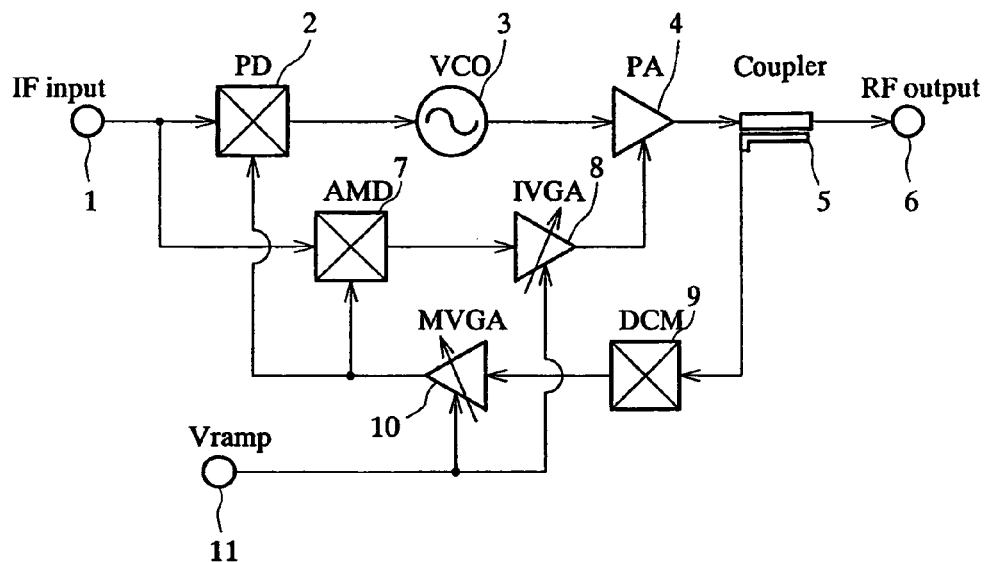
FIG. 2 is a circuit diagram showing a configuration of a polar-loop transmitter examined prior to the present invention.
Figure 3:
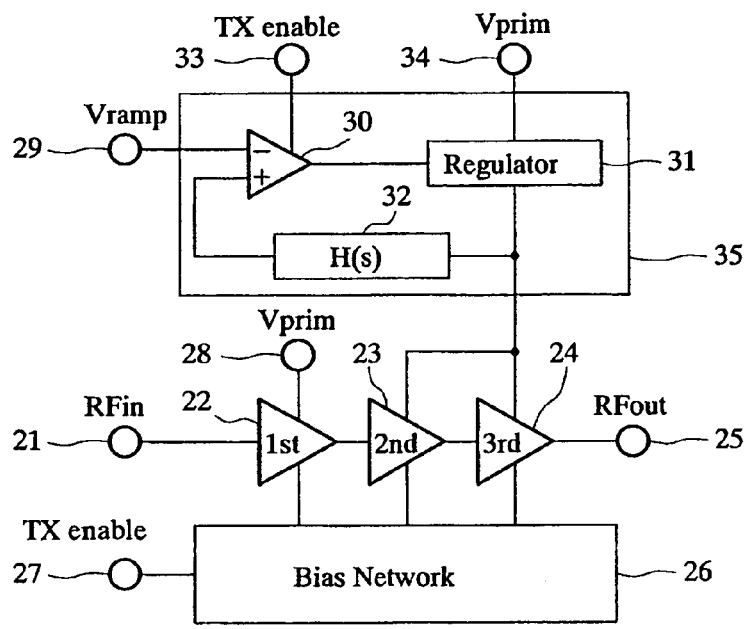
FIG. 3 is a circuit diagram showing a configuration of an LDO-control-type high-frequency power amplifier examined prior to the present invention.
Figure 4:
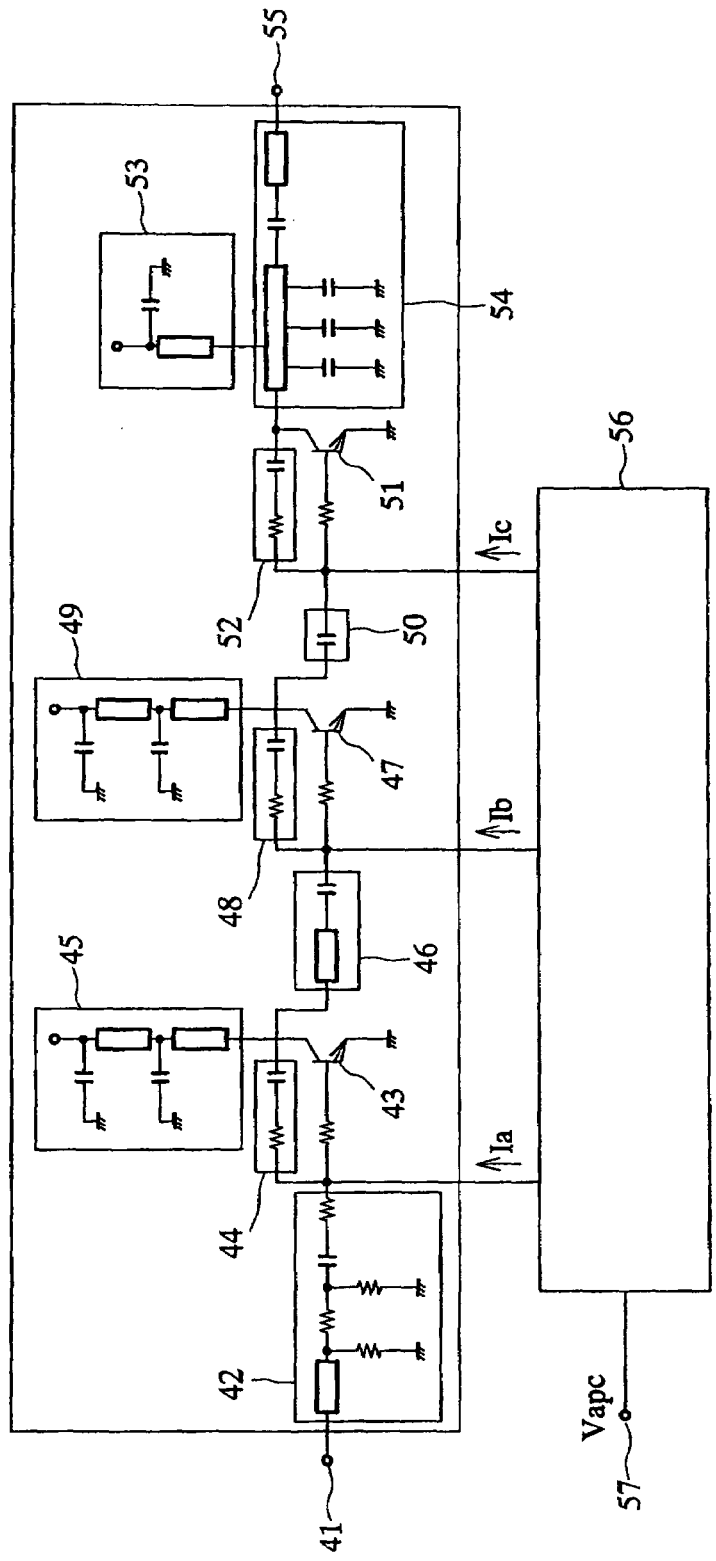
FIG. 4 is a circuit diagram showing a configuration of a bias-control-type high-frequency power amplifier examined prior to the present invention.

FIG. 1 is a circuit diagram showing a configuration of a base-bias-control-type high-frequency power amplifier according to one embodiment of the present invention.

First, one example of a configuration of a high-frequency power amplifier according to this embodiment will be described with reference to FIG. 1. The high-frequency power amplifier according to this embodiment is, for example, a base-bias-control-type high-frequency power amplifier, and it includes an RF input terminal 101, a matching circuit 102, an initial stage transistor 103 (a first amplifying stage transistor), a feedback circuit 104, a power source circuit 105, a matching circuit 106, a second stage transistor 107 (a second amplifying stage transistor), a feedback circuit 108, a power source circuit 109, a matching circuit 110, a third stage transistor 111 (a third amplifying stage transistor), a feedback circuit 112, a power source circuit 113, a matching circuit 114, an RF output terminal 115, a control terminal 116, a bias circuit 144, and others. The bias circuit 144 includes a voltage-current conversion circuit 140, a constant current circuit 141, a constant voltage circuit 142, a constant voltage circuit 143, and others. The voltage-current conversion circuit 140 includes an operational amplifier 117, a p-type MOSFET 118, a resistor 119, a p-type MOSFET 120, a p-type MOSFET121, a p-type MOSFET 122, and others. The constant current circuit 141 includes a resistor 123, a resistor 124, an operational amplifier 125, a p-type MOSFET 126, a resistor 127, a p-type MOSFET 128, a p-type MOSFET 129, an n-type MOSFET 130, an n-type MOSFET 131, and others. The constant voltage circuit 142 includes a transistor 132, a resistor 133, a transistor 134, a resistor 135, and others. The constant voltage circuit 143 includes a transistor 136, a resistor 137, a transistor 138, a resistor 139, and others.

An input signal from the RF input terminal 101 is sequentially amplified via the matching circuit 102, the initial stage transistor 103, the matching circuit 106, the second stage transistor 107, the matching circuit 110, the third stage transistor 111, and the matching circuit 114 to be outputted to the RF output terminal 115. The respective stage transistors 103, 107, and 111 are respectively attached with feedback circuits 104, 108, and 112 to be stabilized. Also, powers to the respective stage transistors 103, 107, and 111 are respectively supplied from the power source circuits 105, 109, and 113. Base bias currents Ia, Ib, and Ic of the respective stage transistors 103, 107, and 111 are supplied from the bias circuit 144.

Operation of the bias circuit 144 will be described below. A control signal (Vapc) from the control terminal 116 is inputted into the operational amplifier 117 in the voltage-current conversion circuit 140 in the bias circuit 144, and the gate of the p-type MOSFET 118 is driven by an output voltage from the operational amplifier 117. A drain current Id of the p-type MOSFET 118 together with a drain current Ie of the p-type MOSFET 128 in the constant current circuit 141 flows into the resistor 119 (resistance value Rd), and a voltage at a connection point of the p-type MOSFET 118 and the resistor 119 is fed back to the operational amplifier 117. The drain current Id of the p-type MOSFET 118 is controlled by the feedback circuit so that the control voltage Vapc inputted into the control terminal 116 satisfies a relationship of Id=(Vapc/Rd)−Ie. Since the gate voltages of the p-type MOSFETs 118, 120, 121, and 122 are common, a drain current ratio among respective p-type MOSFETs is determined by a gate width ratio among them. When gate widths of the p-type MOSFETs 118, 120, 121, and 122 are represented as Wd, Wa, Wb, and Wc and drain currents thereof are represented as Id, Ia, Ibo, and Ico, Ia=Id (Wa/Wd), Ibo=Id (Wb/Wd), and Ico=Id (Wc/Wd) are obtained.

A voltage Voff determined by a power source voltage and a resistance ratio of the resistor 123 and the resistor 124 is inputted into the operational amplifier 125 of the constant current circuit 141. An output from the operational amplifier 125 drives the gate of the p-type MOSFET 126. The drain current Io of the p-type MOSFET 126 flows in the resistor 127 (resistance value Rd). A voltage at a connection point of the p-type MOSFET 126 and the resistor 127 is fed back to the operational amplifier 125. The drain current Io of the p-type MOSFET 126 is controlled to Io=Voff/Rd by the feedback circuit. Since gate voltages of the p-type MOSFETs 126, 128, and 129 are common, a drain current ratio among the respective p-type MOSFETs is determined by a gate width ratio among them. The gate widths of the p-type MOSFETs 126, 128, and 129 are set to Wd, Wd, and Wb, respectively. When the drain currents of the p-type MOSFETs 126, 128, and 129 are represented as Io, Ie, and If, Ie=Io (Wd/Wd) and If=Io (Wb/Wd) are obtained. The drain current If of the p-type MOSFET 129 is multiplied by a mirror ratio by a current mirror circuit configured of the n-type MOSFETs 130 and 131 to be a drain current Ig of the n-type MOSFET 131. When the mirror ratio is x1, Ig=x1·If is obtained.

When a size ratio of transistors 134 and 107 is x2, an output current Ib from the constant voltage circuit 142 satisfies a relationship of Ib=(Ibo−Ig)·(hfe·x2)/(hfe+x2+1) using an input current (Ibo−Ig) and hfe of a transistor. Similarly, when a size ratio of the transistors 138 and 111 is x3, an output current Ic from the constant voltage circuit 143 satisfies a relationship of Ic=Ico·hfe·x3/(hfe+x3+1) by using an input current Ico and hfe of a transistor.

By performing the calculation of the results described above, the bias current Ia, Ib, and Ic supplied to the respective stage transistors satisfy the following equations.

$$Ia = (Vapc - Voff)/Rd \cdot (Wa/Wd)$$

$$Ib = \{Vapc - (1+x1) \cdot Voff\}/Rd \cdot (Wb/Wd) \cdot (hfe \cdot x2)/(hfe+x2+1)$$

$$Ic = (Vapc - Voff)/Rd \cdot (Wc/Wd) \cdot (hfe \cdot x3)/(hfe+x3+1)$$

Rising voltages Vapc of Ia, Ib, and Ic become Voff, (1+x1)Voff, and Voff, respectively when 0 is assigned to Ia, Ib, and Ic.

Therefore, by using the bias circuit 144 according to this embodiment, a difference (namely, x1·Voff) between a rising voltage of the bias current Ib supplied to the second stage transistor 107 and rising voltages of the bias currents Ia and Ic supplied to the initial stage transistor 103 and the third stage transistor 111 can be set to an arbitrary positive value by using the mirror ratio x1. Since the mirror ratio is hardly influenced by process fluctuation, a difference between rising voltages can be set with excellent reproducibility.

The bias-control-type high-frequency power amplifier according to this embodiment can improve linearity of power control by means of adjustment of the mirror ratio x1. FIG. 9B is a graph showing power control characteristics when the mirror ratio x1 is optimized. Different from the examples of the bias circuit shown in FIG. 5 and FIG. 6, a flat region of dVout/dVapc extends to a low output side in which Vout is low, and it can be understood that the power control linearity is improved.

Figure 9A:
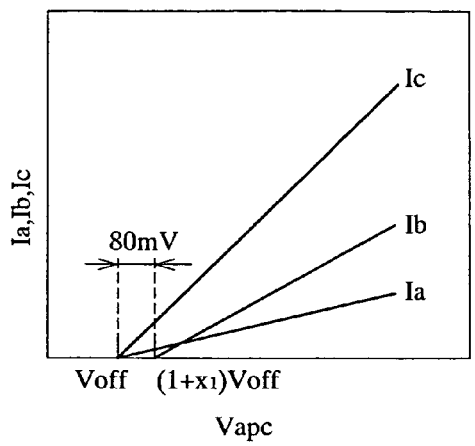
FIG. 9A is a graph showing dependency of bias currents Ia, Ib, and Ic on a control voltage Vapc in the bias circuit shown in FIG. 1.
Figure 9B:
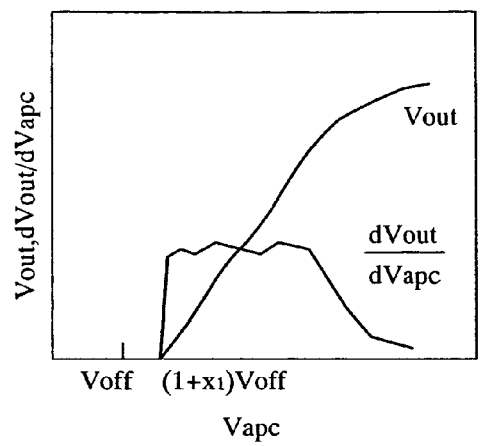
FIG. 9B is a graph showing power control characteristic of a bias-control-type high-frequency power amplifier using the bias circuit shown in FIG. 1.

FIG. 9A is a graph showing dependency of the bias currents Ia, Ib, and Ic on the control voltage Vapc. In this example, an optimal value of rising voltage difference between the bias currents is 80 mV. The transistor used in this example is an InGaAs/GaAs heterojunction bipolar transistor and a base-emitter voltage Vbe is about 1.3 V. Thus, the optimal value of the rising voltage difference between the bias currents generally becomes smaller than Vbe by about one digit (that is, it is preferable that the value is 0.1 time or less the base-emitter voltage Vbe).

Figure 11B:
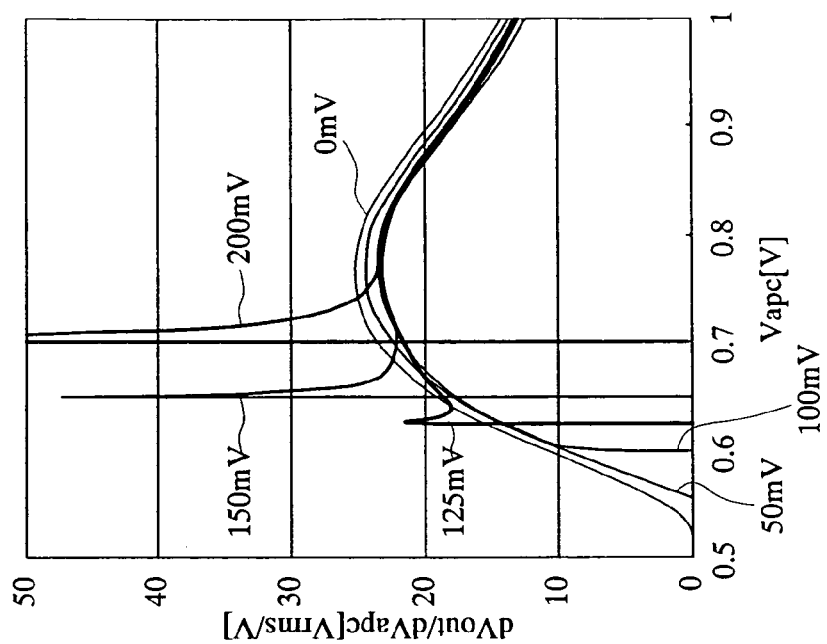
FIG. 11B is a graph showing the simulation result of power control characteristic of a bias-control-type high-frequency power amplifier using the bias circuit shown in FIG. 1.
Figure 11A:
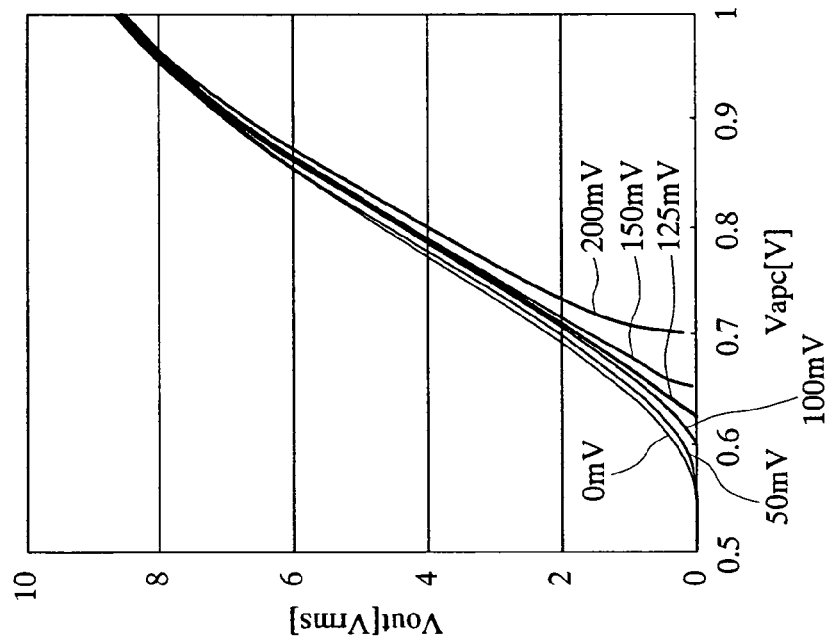
FIG. 11A is a graph showing the simulation result of power control characteristic of a bias-control-type high-frequency power amplifier using the bias circuit shown in FIG. 1.

FIG. 11A and FIG. 11B are graphs showing power control characteristics obtained in the simulation performed while a difference (x1·Voff) between the rising voltage of the bias current Ib and the rising voltages of the bias currents Ia and Ic is sequentially varied to 0 mV, 50 mV, 100 mV, 125 mV, 150 mV and 200 mV. FIG. 11A shows Vout and FIG. 11B shows dVout/dVapc. Note that the simulation is performed under the condition that Voff is 500 mV. As understood from FIG. 11A and FIG. 11B, the most preferable result can be obtained at a point where the rising voltage difference between the bias currents is 125 mV. Although this value is slightly higher than the actual measurement value (80 mV) shown in FIG. 9A, it is due to the simulation error. From this result, it is supposed that the optimal value of the rising voltage difference between bias currents is equal to or less than about 200 mV.

Figure 5:
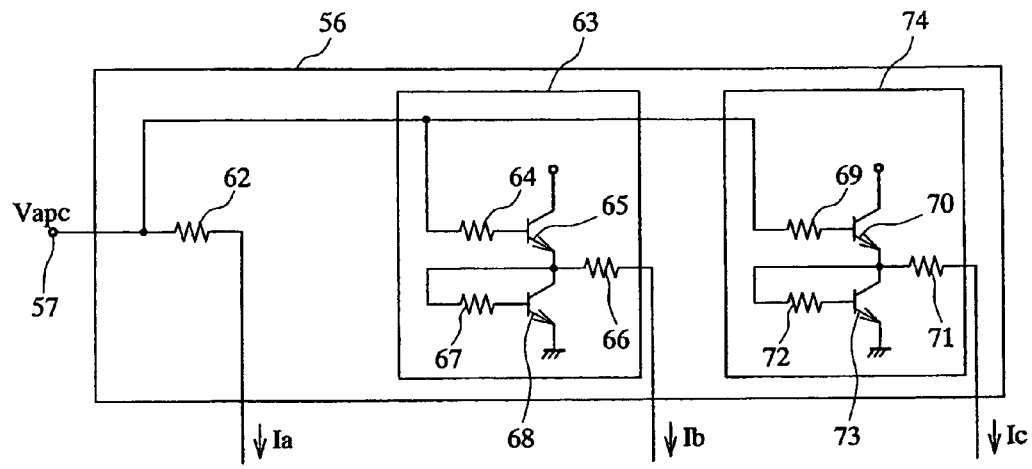
FIG. 5 is a circuit diagram showing a configuration of a bias circuit examined prior to the present invention.
Figure 6:
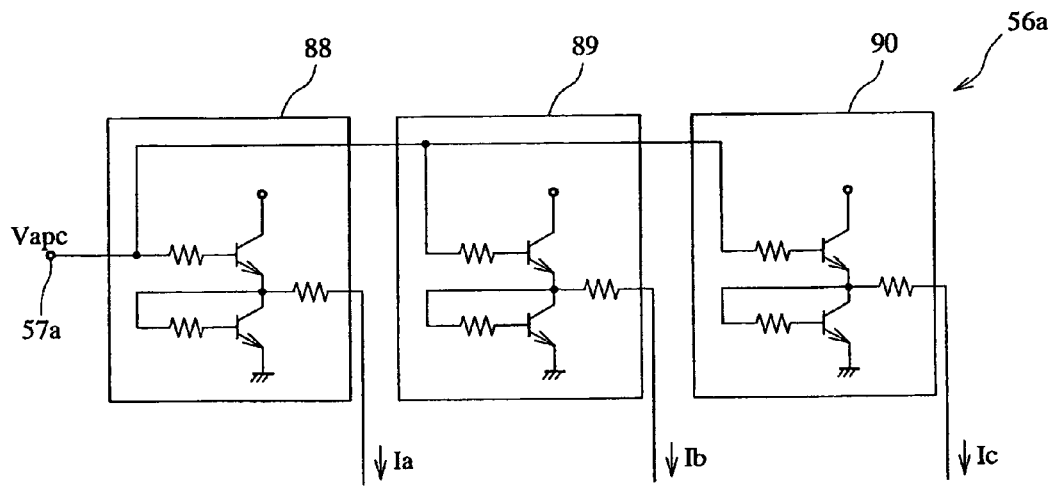
FIG. 6 is a circuit diagram showing a configuration of a bias circuit examined prior to the present invention.
Figure 7A:
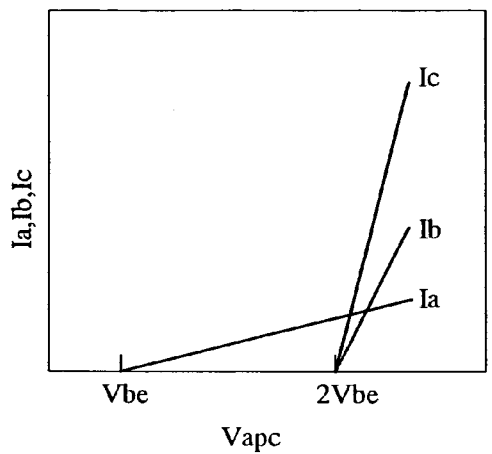
FIG. 7A is a graph showing dependency of bias currents Ia, Ib, and Ic on a control voltage Vapc in the bias circuit shown in FIG. 5.
Figure 7B:
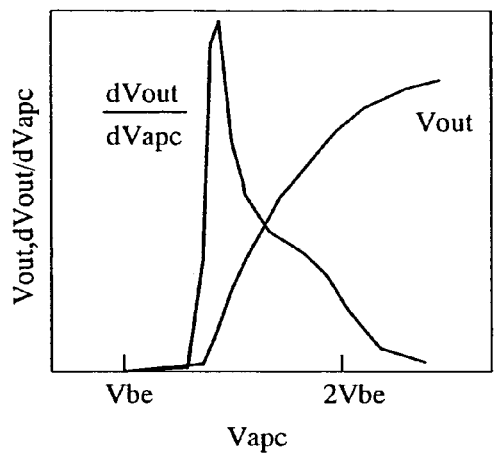
FIG. 7B is a graph showing power control characteristic of a bias-control-type high-frequency power amplifier using the bias circuit shown in FIG. 5.
Figure 8A:
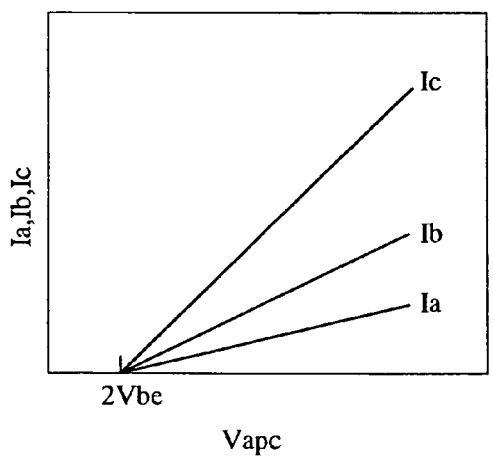
FIG. 8A is a graph showing dependency of bias currents Ia, Ib, and Ic on a control voltage Vapc in the bias circuit shown in FIG. 6.
Figure 8B:
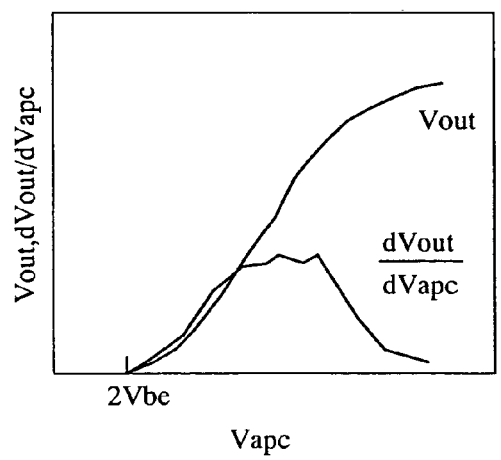
FIG. 8B is a graph showing power control characteristic of a bias-control-type high-frequency power amplifier using the bias circuit shown in FIG. 6.

Even when using the bias circuit shown in FIG. 5, it is possible to provide a difference between rising voltages. However, since a settable difference is limited to Vbe, effect on improvement in power control linearity obtained in this embodiment cannot be realized. In other words, the effect on improvement in power control linearity according to this embodiment can be achieved when a rising voltage difference smaller than Vbe by about one digit is provided by using the bias circuit according to this embodiment which can realize an arbitrary rising voltage difference, and it cannot be realized in the conventional art.

Figure 10A:
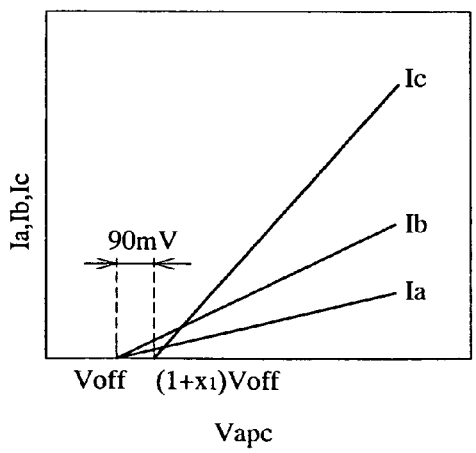
FIG. 10A is a graph showing dependency of bias currents Ia, Ib, and Ic on a control voltage Vapc in a bias circuit according to another embodiment of the present invention.
Figure 10B:
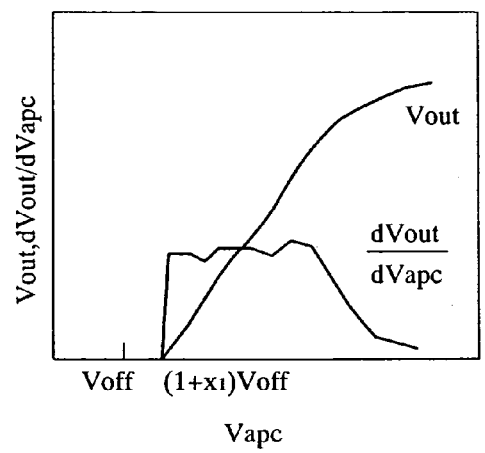
FIG. 10B is a graph showing power control characteristic of a bias-control-type high-frequency power amplifier using the bias circuit according to the embodiment of the present invention.

Note that, through the circuit modification to the circuit shown in FIG. 1 by those skilled in the art, it is possible to realize a bias circuit, in which a difference between a rising voltage of a bias current Ic supplied to the third stage transistor 111 and rising voltages of bias currents Ia and Ib supplied to the initial stage transistor 103 and the second stage transistor 107 can be set to an arbitrary positive value. Even in this case, effect on improvement in power control linearity similar to that of this embodiment can be obtained by adjusting the rising voltage difference. A specific example of the power control characteristics is shown in FIG. 10B. As understood from FIG. 10A, the optimal value of the rising voltage difference between bias currents in this example is 90 mV. Note that a transistor used in this example is an InGaAs/GaAs heterojunction bipolar transistor.

Similarly, through the circuit modification to the circuit shown in FIG. 1 by those skilled in the art, it is also possible to realize a bias circuit, in which a difference between a rising voltage of a bias current Ia supplied to the initial stage transistor 103 and rising voltages of bias currents Ib and Ic supplied to the second stage transistor 107 and the third stage transistor 111 can be set to an arbitrary value. In this case, however, effect on improvement in power control linearity is small.

Similarly, through the circuit modification to the circuit shown in FIG. 1 by those skilled in the art, it is also possible to realize a bias circuit, in which a difference between a rising voltage of a bias current supplied to one stage transistor and rising voltages of bias currents supplied to the other stage transistors can be set to an arbitrary negative value. Also in this case, however, effect on improvement in power control linearity is small. Accordingly, a method for shifting a rising voltage of a bias current supplied to the transistors other than the initial stage transistor toward a positive side relative to the rising voltage of the bias current supplied to the initial stage transistor is particularly effective in order to obtain the effect on improvement in power control linearity.

The reason why such an effect can be obtained is that, by setting a rising voltage of a bias current supplied to an initial amplifying stage transistor to be lower than rising voltages of bias currents supplied to amplifying stage transistors other than the initial amplifying stage transistor by several tens mV to several hundreds mV, the initial amplifying stage transistor is already operating at a time when the amplifying stage transistors other than the initial stage transistor start to operate, and therefore, the linear region of power control is expanded.

Accordingly, the bias-control-type high-frequency power amplifier according to this embodiment is excellent in power control linearity and can achieve the efficiency improvement in comparison with the LDO-control-type high-frequency power amplifier. Also, by using the bias-control-type high-frequency power amplifier according to this embodiment in a polar-loop transmitter, a high efficiency transmitter suitable for use in the EDGE system can be realized.

That is, according to this embodiment, power control linearity of a high-frequency power amplifier can be improved, a high-frequency power amplifier usable in the polar-loop transmitter can be realized, and a high-frequency power amplifier which can achieve the efficiency improvement in comparison with the LDO-control-type high-frequency power amplifier can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

In the above-described embodiment, for example, though the case where the heterojunction bipolar transistor is used as the amplifying stage transistor has been described, the amplifying stage transistor is not limited to the heterojunction bipolar transistor, and another transistor can be applied to the amplifying stage transistor.

In the above-described embodiment, though the case where the amplifying stage transistors have the three-stage configuration has been described, the amplifying stage transistors are not limited to the three-stage configuration, and the present invention is applicable to a high-frequency power amplifier with a two-stage configuration.

In the description above, though the case where the invention made by the inventors of the present invention has been applied to the polar-loop transmitter used in a mobile phone terminal included in the technical field to which the present invention belongs has been described, the present invention is not limited to the polar-loop transmitter, and it can be applied to other communication devices.

What is claimed is:

1. A high-frequency power amplifier comprising:
    a plurality of amplifying stage transistors; and
    a bias circuit which supplies a base bias current to each amplifying stage transistor of said plurality of amplifying stage transistors,
    wherein said base bias current supplied to each amplifying stage transistor varies linearly to a control voltage inputted into said bias circuit,
    wherein a first control voltage at which a first base bias current supplied to a first amplifying stage transistor in an initial stage of said plurality of amplifying stage transistors rises is lower than a second control voltage at which a second base bias current supplied to a second amplifying stage transistor other than the initial stage rises, and
    wherein a difference between said second control voltage and said first control voltage is smaller than a base-emitter voltage of said amplifying stage transistor.

2. The high-frequency power amplifier according to claim 1,
    wherein the difference between said second control voltage and said first control voltage is larger than 0 V and equal to or less than 0.1 time the base-emitter voltage of said amplifying stage transistor.

3. The high-frequency power amplifier according to claim 1,
    wherein the difference between said second control voltage and said first control voltage is larger than 0 V and equal to or smaller than 200 mV.

4. The high-frequency power amplifier according to claim 1,
    wherein said bias circuit has a circuit for adjusting the difference between said second control voltage and said first control voltage.

5. The high-frequency power amplifier according to claim 4,
    wherein the circuit for adjusting the difference between said second control voltage and said first control voltage is stabilized by a current mirror circuit.

6. The high-frequency power amplifier according to claim 1,
    wherein said bias circuit comprises:
    a voltage-current conversion circuit which converts a control voltage inputted to said bias circuit to a current;
    a constant current circuit which adds an offset current to the current converted by said voltage-current conversion circuit; and
    a constant voltage circuit which receives the current converted by said voltage-current conversion circuit to output said base bias current.

7. The high-frequency power amplifier according to claim 6,
    wherein said constant current circuit includes a current mirror circuit and is stabilized by said current mirror circuit.

8. The high-frequency power amplifier according to claim 1,
    wherein said plurality of amplifying stage transistors have three-stage configuration,
    wherein said second amplifying stage transistor is an amplifying stage transistor in a second stage, and wherein a third control voltage at which a third base bias current supplied to a third amplifying stage transistor in a third stage rises is equal to said first control voltage in the initial stage.

9. The high-frequency power amplifier according to claim 1,
wherein said plurality of amplifying stage transistors have three-stage configuration,
wherein said second amplifying stage transistor is an amplifying stage transistor in a third stage, and
wherein a third control voltage at which a third base bias current supplied to a third amplifying stage transistor in a second stage rises is equal to said first control voltage in the initial stage.

10. The high-frequency power amplifier according to claim 1,
wherein said plurality of amplifying stage transistors are heterojunction bipolar transistors.

* * * * *